US012669757B2

(12) United States Patent
Chen

(10) Patent No.: US 12,669,757 B2
(45) Date of Patent: Jun. 30, 2026

(54) MASK INSPECTION APPARATUS WITH A PLATFORM MODULE

(71) Applicant: STEK CO., LTD., New Taipei City (TW)

(72) Inventor: Ming-Sheng Chen, New Taipei City (TW)

( * ) Notice: Subject to any disclaimer, the term of this patent is extended or adjusted under 35 U.S.C. 154(b) by 537 days.

(21) Appl. No.: 18/224,063

(22) Filed: Jul. 20, 2023

(65) Prior Publication Data

US 2024/0027922 A1      Jan. 25, 2024

(51) Int. Cl.
*G03F 7/00*       (2006.01)
*G03F 1/84*       (2012.01)

(52) U.S. Cl.
CPC ............ *G03F 7/70825* (2013.01); *G03F 1/84* (2013.01); *G03F 7/70716* (2013.01); *G03F 7/7085* (2013.01)

(58) Field of Classification Search
CPC .... G03F 7/70825; G03F 1/84; G03F 7/70716; G03F 7/7085; G03F 1/66; G03F 7/70658; G01N 21/94; G01N 21/01; G01N 21/13; G01N 21/956; G01N 2021/0112
USPC .......................................................... 430/5
See application file for complete search history.

(56) References Cited

U.S. PATENT DOCUMENTS

| | | | | |
|---|---|---|---|---|
| 5,040,431 | A | * 8/1991 | Sakino | .................. F16C 29/025 |
| | | | | 248/661 |
| 2004/0233412 | A1* | 11/2004 | Ono | ..................... G03F 7/70716 |
| | | | | 355/72 |
| 2005/0280792 | A1* | 12/2005 | Meyer | ....................... G03F 1/84 |
| | | | | 850/26 |
| 2020/0272063 | A1* | 8/2020 | Johnston | ............. G03F 7/70258 |
| 2024/0027895 | A1* | 1/2024 | Chen | ................... G03F 7/70833 |

OTHER PUBLICATIONS

Choi (Year: 2023).*

* cited by examiner

*Primary Examiner* — Caleen O Sullivan
(74) *Attorney, Agent, or Firm* — BruceStone LLP; Joseph A. Bruce

(57)       ABSTRACT

A mask inspection machine includes a platform unit for carrying a transparent container. The transparent container includes a lower window and an upper window. The platform unit includes a platform and a carrier. The platform includes a slot. The carrier is movable on the platform along the slot. The carrier includes a plate and guiding elements. The plate includes a support face including an inspection window corresponding to the lower window of the transparent container. The guiding elements are connected to the support face for guiding the transparent container onto the support face.

14 Claims, 8 Drawing Sheets

MASK INSPECTION APPARATUS WITH A PLATFORM MODULE

BACKGROUND OF INVENTION

1. Field of Invention

The present invention relates to carriage of a mask package in a mask inspection machine and, more particularly, to a carrier for a mask package.

2. Related Prior Art

A mask must be located in a highly clean and air-tight and anti-static transparent container, i.e., a reticle SMIF pod ("RSP") to keep the mask from contamination and resultant defection during transportation or storage. However, the RSP has to be opened to allow the mask to be taken from the RSP to be covered by a protective film (protective film (108)) or inspected. In such occasions, particles or other contaminants can be attached to the mask. Repeated opening and closing of the RSP can entail friction or impacts that can produce particles or generate static charges that increase the risks of the mask being contaminated. A clean room in which such processes are executed must be upgraded. Furthermore, the mask must be cleaned more frequently and/or sent back to a manufacturer for maintenance faster than scheduled. As lithographic processes are getting more sophisticated and expensive, such masks must be protected better than before.

Moreover, scrutinizing of the protective film, the mask and a pattern of a circuit on the mask with a conventional mask inspection apparatus is affected by the position of a light source, the angle of a light beam from the light source, translucency and resolution. To minimize the affection, use of two mask inspection apparatuses to inspect two opposite sides of the mask is preferred to use of a mask inspection apparatus and flipping the mask to allow the opposite sides of the mask to be inspected one after another. Unfortunately, it is expensive to buy or maintain such a mask inspection apparatus. In addition, such a mask inspection apparatus requires mechanisms for feeding, storing and opening the RSP, thereby increasing the size and cost of such a mask inspection apparatus.

The present invention is therefore intended to obviate or at least alleviate the problems encountered in the prior art.

SUMMARY OF INVENTION

It is the primary objective of the present invention to provide a mask inspection apparatus with a platform module for carrying a transparent container containing a mask so that the mask inspection apparatus inspects the mask having to move the mask from the transparent container includes a lower window and an upper window.

The platform module includes a platform and a carrier. The platform includes a slot. The carrier is movable on the platform along the slot. The carrier includes a plate and guiding elements. The plate includes a support face including an inspection window corresponding to a lower window of the transparent container. The guiding elements are connected to the support face for guiding the transparent container onto the support face.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1:
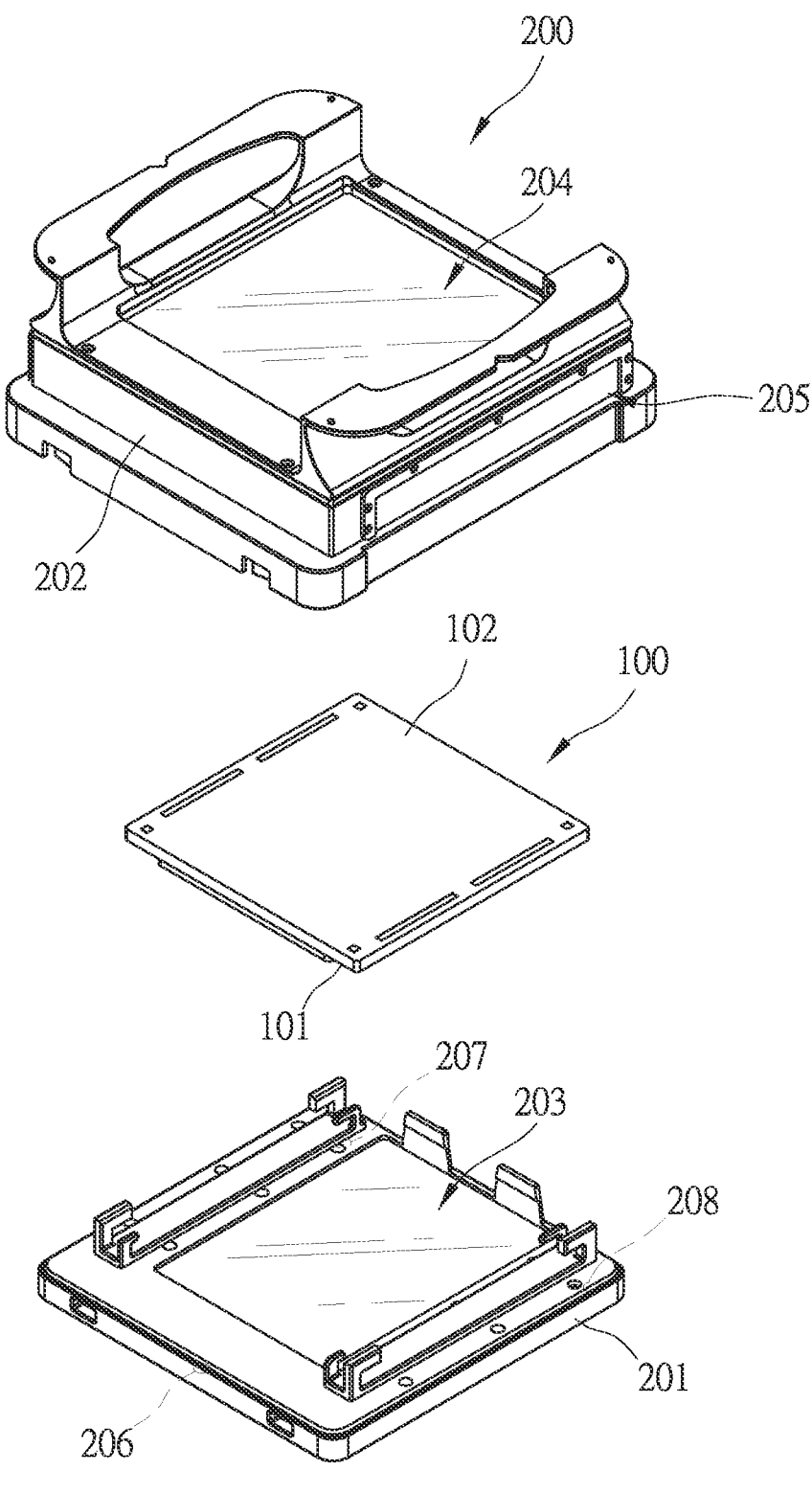
FIG. 1 is an exploded view of a transparent container and a mask.

Referring to FIGS. 1, 2, 7 and 8, a mask 100 is located in a transparent container 200 before it is scrutinized with a mask inspection apparatus 800 according to the preferred embodiment of the present invention. The mask 100 includes a lower face 101 in parallel to an upper face 102.

Figure 2:
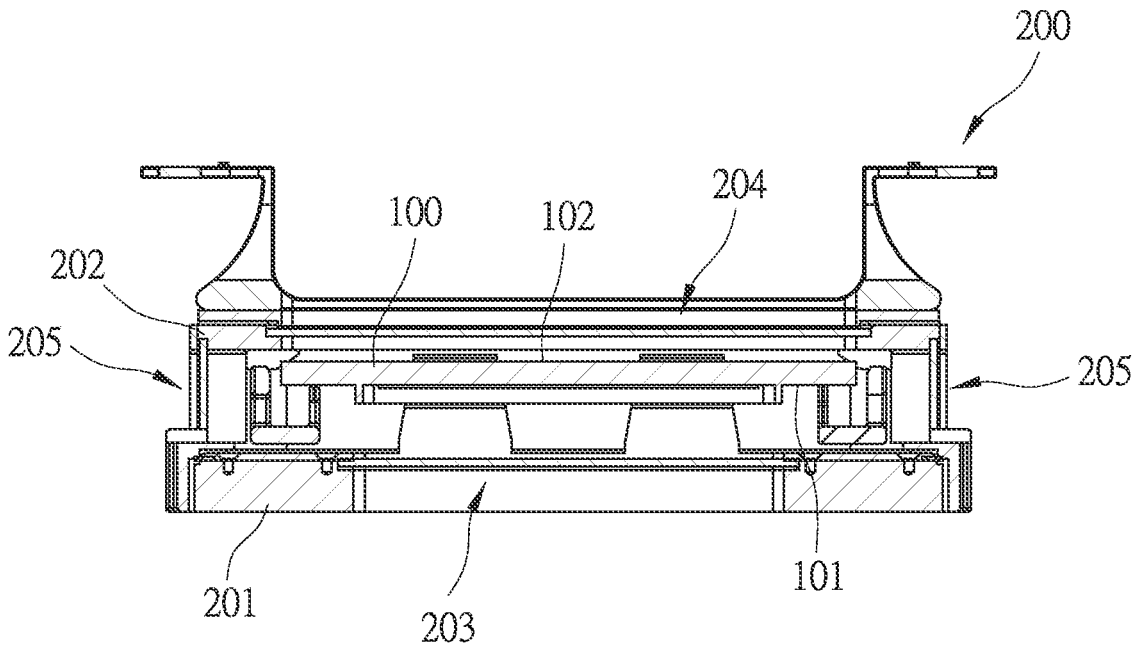
FIG. 2 is a cross-sectional view of the transparent container and the mask shown in FIG. 1.

Referring to FIGS. 1 and 2, the transparent container 200 preferably includes a cover 203 and a base 204. To receive the mask 100, the transparent container 200 is opened, i.e., the cover 203 is taken from the base 204. To keep the mask 100 in the transparent container 200, the cover 203 is laid on the base 204, i.e., the transparent container 200 is closed.

The transparent container 200 includes a lower window 201 in the base 204, an upper window 202 in the cover 203, and two opposite lateral windows 205 in the cover 203. The lower window 201 is similar to but preferably larger than the lower face 101 of the mask 100. The upper window 202 is similar to but preferably larger than the upper face 102 of the mask 100. The lateral windows 205 are similar to but preferably larger than lateral faces (or "edges") of the mask 100. Light can be cast on the upper face 102 of the mask 100 via the upper window 202. Light can be cast on the lower face 101 of the mask 100 through the lower window 201. Light can be cast on the lateral faces of the mask 100 via the lateral windows 205. The base 201 further includes three bores 206, 207 and 208 in a lower face.

The mask inspection apparatus 800 includes a platform unit 10 located between a first (or "lower") inspection unit 810 and a second (or "upper") inspection unit 820. The first inspection unit 810 is vertically movable relative to the platform unit 10 to precisely scrutinize the lower face 101 of the mask 100. The second inspection unit 820 is vertically movable relative to the platform unit 10 to precisely scrutinize the upper face 102 of the mask 100.

Referring to FIGS. 3 through 6, the platform unit 10 includes a platform 11 and a carrier 20. The platform 11 includes a slot 12 along which the carrier 20 is movable, i.e., along an along an X-axis. Additionally, there are a Y-axis horizontally extending in perpendicular to the X-axis and a Z-axis vertically extending in perpendicular to the X-axis and the Y-axis.

The carrier 20 is translated or stopped on the platform 11. The carrier 20 carries the mask 100 alone or the mask 100 located in the transparent container 200. Preferably, the mask 100 is located in the transparent container 200 before they both are located on the carrier 20.

The carrier 20 includes a plate 21, guiding elements 23 and a sensor 24. The plate 21 includes a support face 22 extending lower than a marginal portion of the plate 21. The guiding elements 23 are located on the support face 22 at corners. The guiding elements 23 define a region compliant to the base 204 of the transparent container 200 so that the transparent container 200 can precisely be located on the support face 22 of the plate 21.

The sensor 24 detects whether the base 204 of the transparent container 200 is in tight contact with the support face 22.

Moreover, the plate 22 includes an inspection window 25 in the support face 22 corresponding to the lower window 201 of the transparent container 200 located on the support face 22.

Positioning bosses 281, 282 and 283 extend from the support face 22 around the inspection window 25. The positioning bosses 281, 282 and 283 are insertable in the bores 206, 207 and 208 made in the base 204 of the transparent container 200 so that the transparent container 200 is precisely and firmly located on the support face 22.

Figure 5:
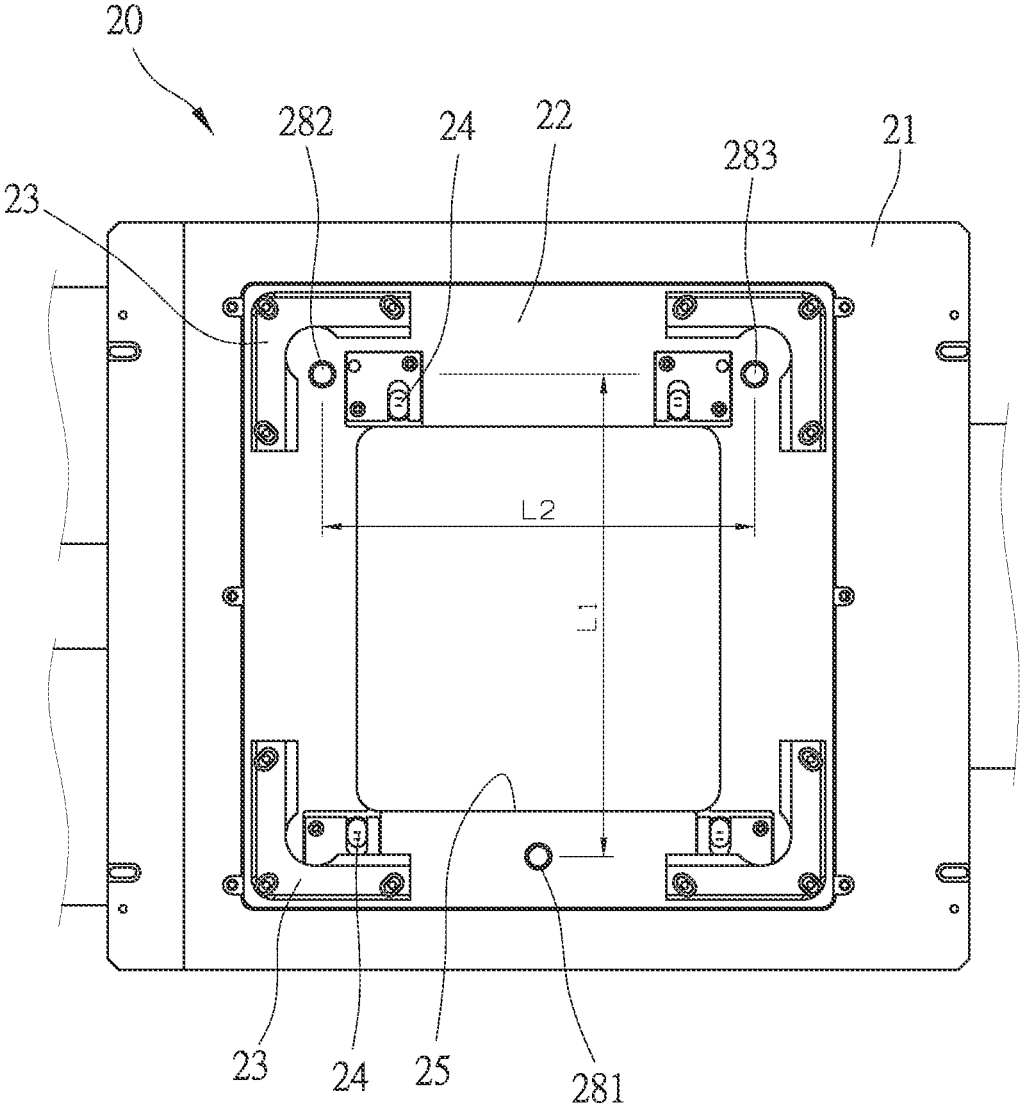
FIG. 5 is a top view of the carrier shown in FIG. 3.

Referring to FIG. 5, the positioning bosses 281, 282 and 283 are arranged in a triangle. The shortest distance L1 of the first positioning boss 281 from a line extending between the second and third positioning bosses 232 and 283 is 172 to 173.5 mm, preferably 172.9±0.1 mm. The distance L2 of the second positioning boss 282 from the third positioning boss 283 is 157.8 to 158.8 mm, preferably 158.21±0.1 mm.

Two tracks 26 extends on a lower face of the platform 11 along two opposite internal edges of the platform 11 by the slot 16, i.e., in parallel to the X-axis. Thus, the tracks 26 are located on two opposite sides of the plate 21. The carrier 20 is movable along the tracks 26. Thus, the carrier 20 carries the transparent container 200 along the X-axis.

Figure 6:
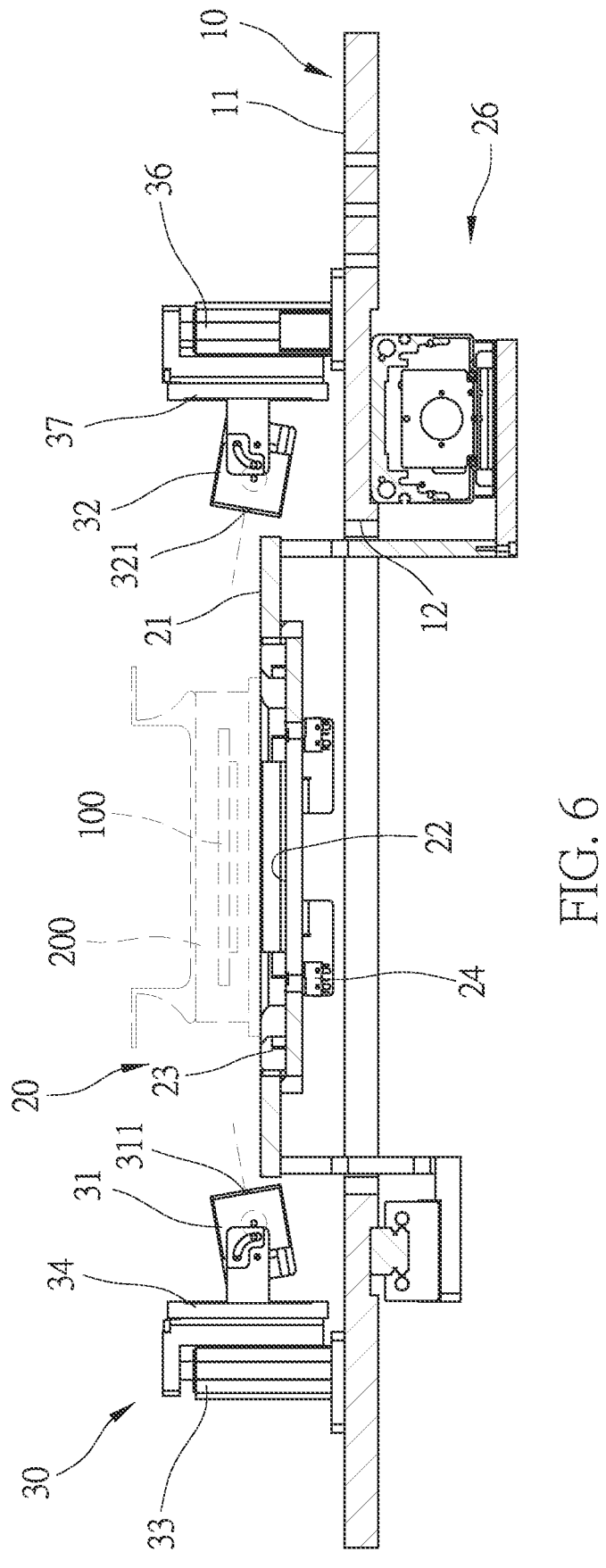
FIG. 6 is another cross-sectional view of the carrier shown in FIG. 3.

The platform unit 10 further include a lateral light source module 30. The light source module 30 includes two light boxes 31 and 32, two vertical planks 34 and 37 and two columns 33 and 36 (FIGS. 5 and 6). The light boxes 31 and 32 are located between the and image scanners 30 and 40.

The column 33 is formed on the platform 11, on a side of the slot 16. The column 33 includes a track (not numbered) along which the vertical plank 34 is movable in parallel to the Z-axis. The vertical plank 34 includes two lugs 312. The light box 31 is formed with two pivots 35 extending in parallel to the X-axis. The pivots 35 are inserted in the lugs 312 so that the light box 31 is pivotable relative to the vertical plank 34. The light box 31 includes a slit 311 in parallel to the X-axis. Thus, the light box 31 is allowed to cast light on the upper face 102 or the lower face 101 of the mask 100 at angle of 0 to 6 degrees (FIGS. 7 and 8).

The column 36 is formed on the platform 11, on an opposite side of the slot 16. The column 36 includes a track (not numbered) along which the vertical plank 37 is movable in parallel to the Z-axis. The vertical plank 37 includes two lugs 322. The light box 32 is formed with two pivots 38 extending in parallel to the X-axis. The pivots 38 are inserted in the lugs 322 so that the light box 32 is pivotable relative to the vertical plank 37. The light box 32 includes a slit 321 in parallel to the X-axis. Thus, the light box 32 is allowed to cast light on the upper face 102 or the lower face 101 of the mask 100 at angle of 0 to 6 degrees (FIGS. 7 and 8).

Figure 7:
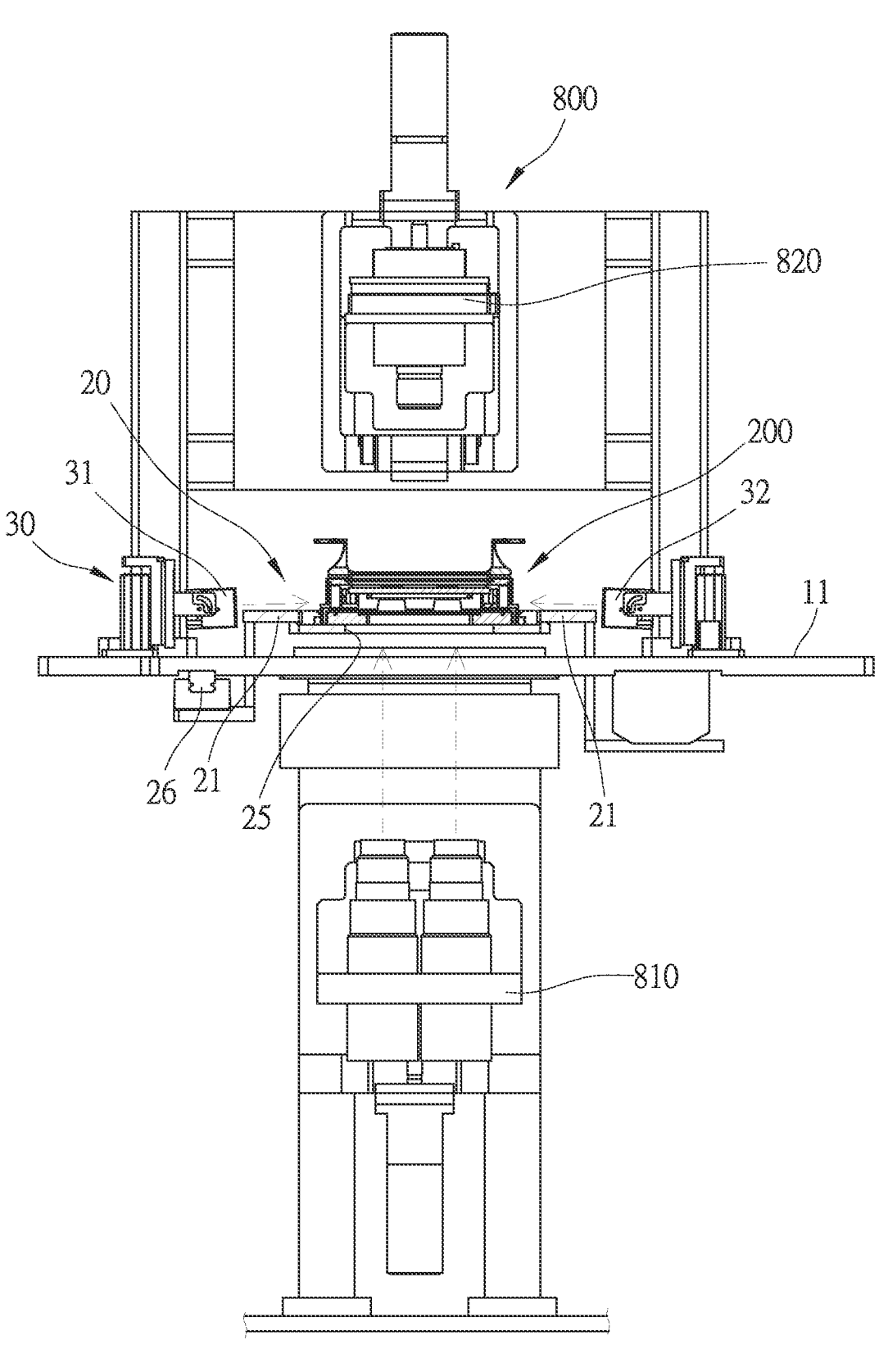
FIG. 7 is a front view of the carrier shown in FIG. 3 and a mask inspection apparatus.
Figure 8:
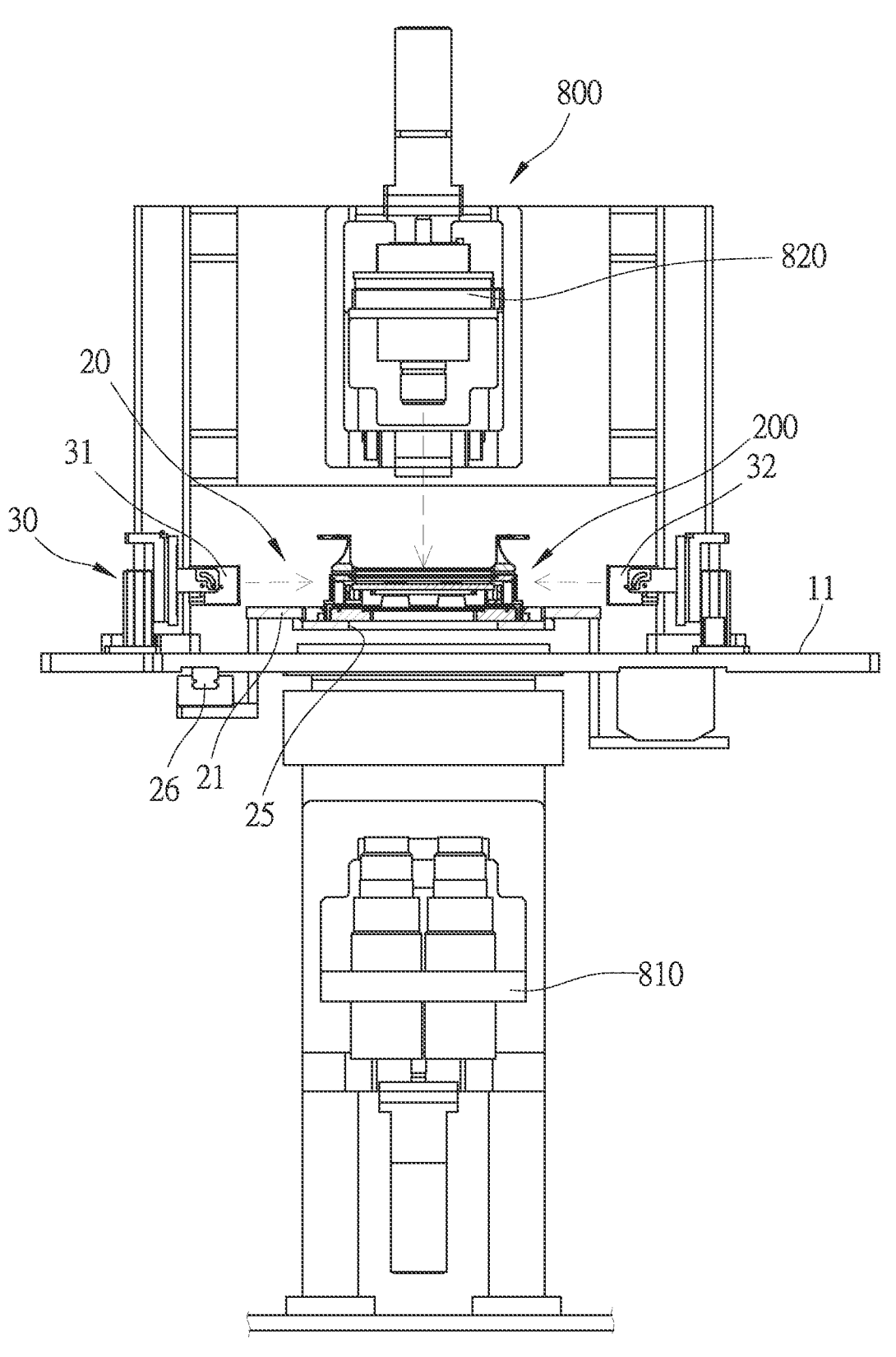
FIG. 8 is a front view of the carrier and the mask inspection apparatus in another phase of scrutinizing the mask than shown in FIG. 7.

Referring to FIGS. 7 and 8, a mask inspection apparatus 800 inspects the mask 100 in the transparent container 200. The first inspection unit 810 of the mask inspection apparatus 800 scrutinizes the lower faces 101 of the mask 100 in the transparent container 200 on the carrier 20 (referring to FIG. 7). The second inspection unit 820 of the mask inspection apparatus 800 scrutinizes the upper face 102 of the mask 100 in the transparent container 200 on the carrier 20 (referring to FIG. 8).

Figure 3:
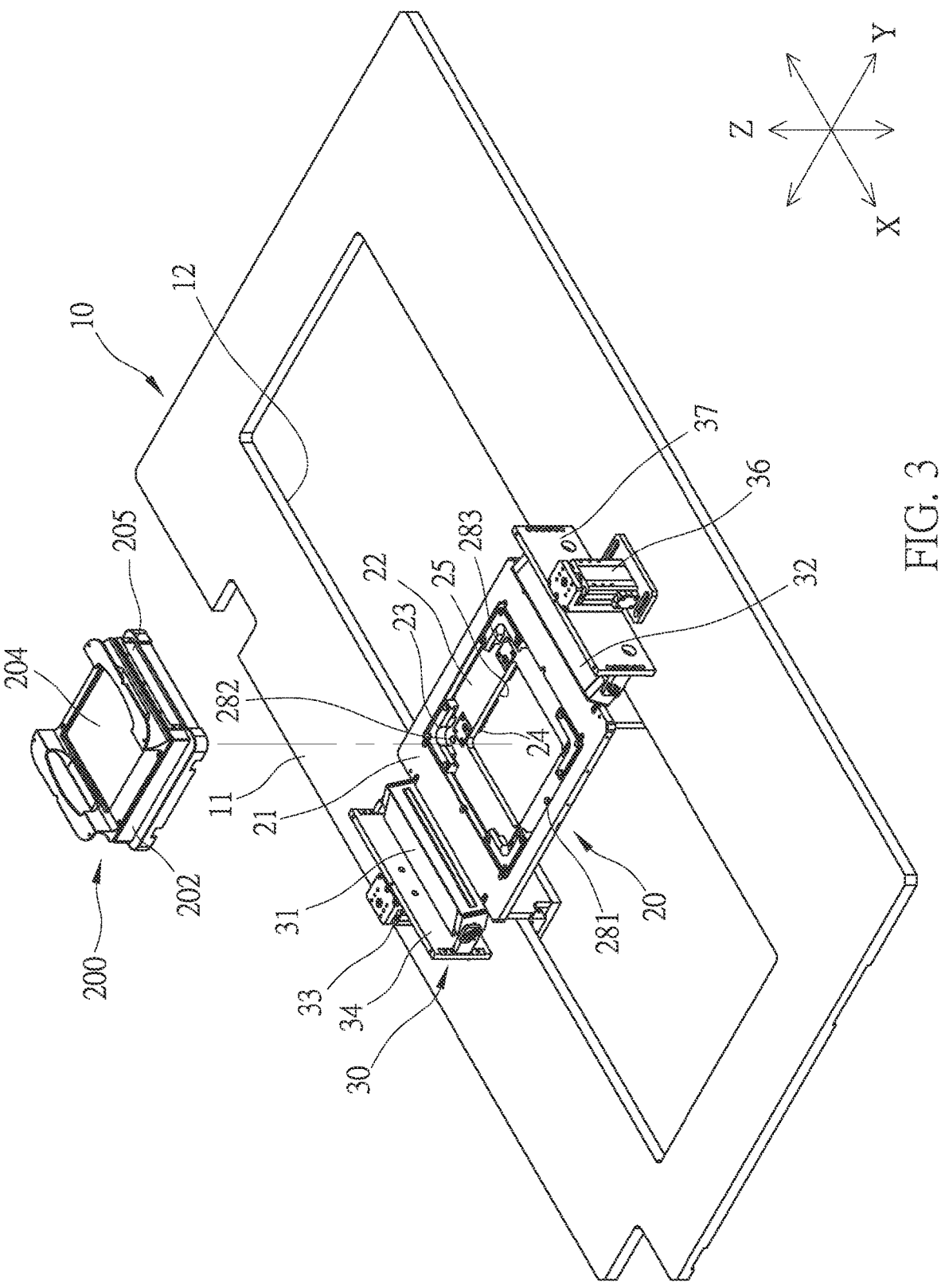
FIG. 3 is a perspective view of a carrier of a mask inspection apparatus according to the preferred embodiment of the present invention.
Figure 4:
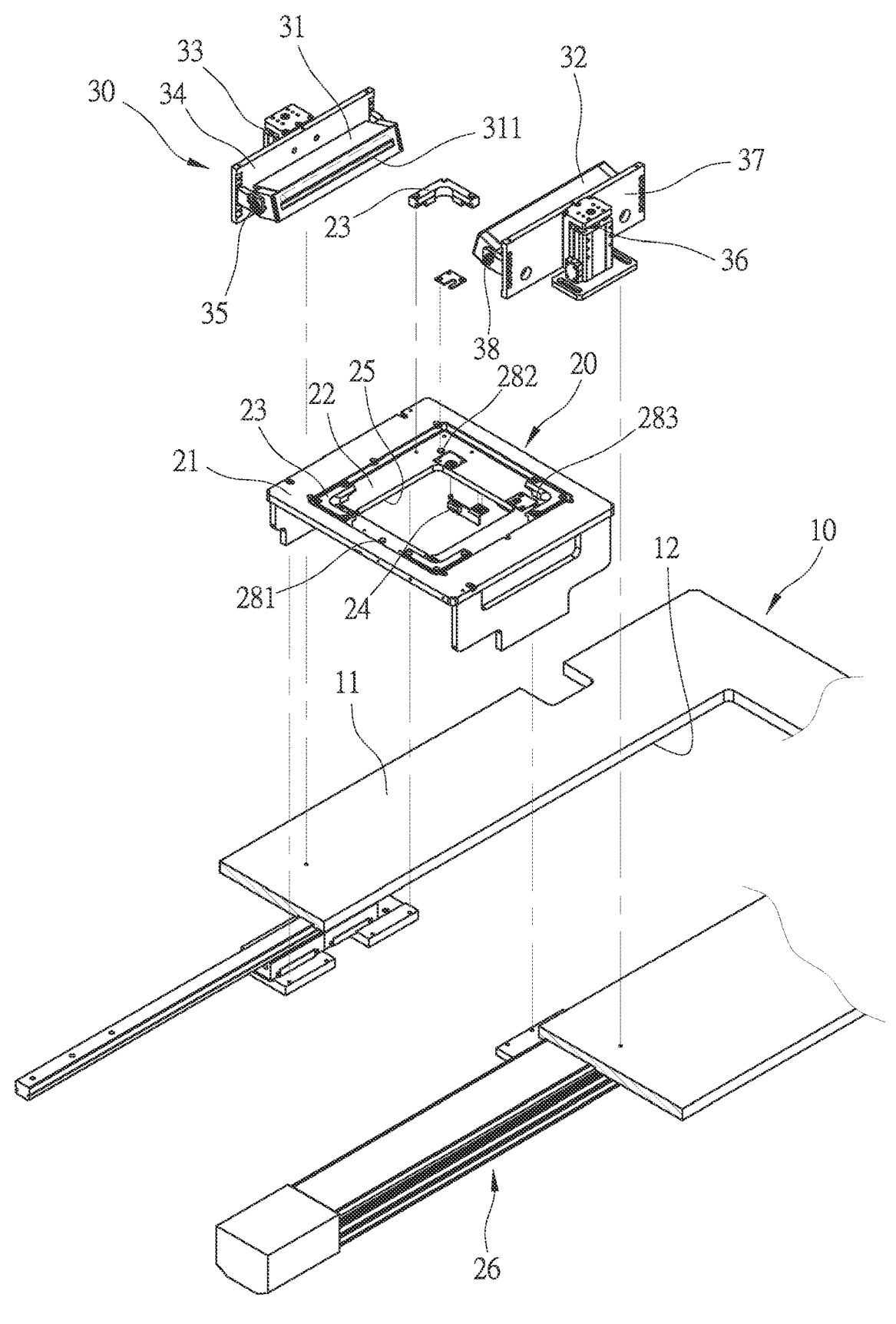
FIG. 4 is an exploded view of the carrier shown in FIG. 3.

Referring to FIG. 3, the mask 100 is located in the transparent container 200 before they are located on the carrier 20. The guiding elements 23 guide the transparent container 200 onto the support face 22. The sensor 24 detects whether the bottom of the transparent container 200 is in proper contact with the support face 22. The first, second and third positioning bosses 281, 282 and 283 extending from support face 22 are inserted in the first, second and third recesses 206, 207 and 208 made in the bottom of the transparent container 200 (FIGS. 5 and 6) to ensure precise and firm location of the transparent container 200 on the support face 22.

Referring to FIG. 7, as the transparent container 200 is located on the carrier 20 precisely, the carrier 20 is moved along the X-axis to a position immediately above the first inspection unit 810. The first and second light boxes 31 and 32 of the lateral light source module 30 are lowered along the Z-axis so that the first and second light boxes 31 and 32 cast light on the lower face 101 of the mask 100 via the lateral windows 205 of the transparent container 200. The first and second light boxes 31 and 32 are tilted so that they cast the light on the lower face 101 of the mask 100 at an angle of 0 to 6 degrees. Then, the first inspection unit 810 inspects the lower face 101 of the mask 100 via the lower window 203 of the transparent container 200, thereby finding defects, their positions and sizes.

Referring to FIG. 8, as the transparent container 200 is located on the carrier 20 precisely, the carrier 20 is moved along the X-axis to a position immediately below the second inspection unit 820. The first and second light boxes 31 and 32 of the lateral light source module 30 are lowered along the Z-axis so that the first and second light boxes 31 and 32 cast light on the upper face 102 of the mask 100 via the lateral windows 205 of the transparent container 200. The first and second light boxes 31 and 32 are tilted so that they cast the light on the upper face 102 of the mask 100 at an angle of 0 to 6 degrees. Then, the second inspection unit 820 inspects the upper face 102 of the mask 100 via the upper window 204 of the transparent container 200, thereby finding defects, their positions and sizes.

As described above, the mask inspection apparatus 800 inspects the first and second faces 101 and 102 of the mask 100 in the transparent container 200. The mask 100 is retained in the transparent container 200, thereby avoiding additional defects on the mask 100 that could otherwise occur due to contact with contaminants out of the transparent container 200. The efficiency and precision of the inspection of the mask 100 are improved. The mask inspection apparatus is downsized without having to use a feeding mechanism, a storing mechanism or a container-opening mechanism. The costs for making and maintaining the mask inspection apparatus is reduced.

The present invention has been described via the illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A platform unit of a mask inspection machine for carrying a transparent container formed with a lower window and an upper window, the platform unit comprising:
   a platform comprising a slot; and
   a carrier movable on the platform along the slot, wherein the carrier comprising
      a plate comprising a support face comprising an inspection window corresponding to the lower window of the transparent container; and
      guiding elements connected to the support face for guiding the transparent container onto the support face.

2. The carrier according to claim 1, wherein guiding elements are located at corners of the support face.

3. The carrier according to claim 1, wherein the carrier further comprises a sensor on the support face to detect whether a lower face of the transparent container is in proper contact with the support face.

4. The carrier according to claim 1, wherein the carrier further comprises a first positioning boss, a second positioning boss and a third positioning boss arranged in a triangle on the support face within the guiding elements, wherein the first, second and third positioning bosses are insertable in three bores made in the transparent container.

5. The carrier according to claim 4, wherein the shortest distance of the first positioning boss from a line between the second and third positioning bosses is 172 to 173.5 mm, wherein a distance between the second and third positioning bosses is 157.8 to 158.8 mm.

6. The carrier according to claim 5, wherein the shortest distance of the first positioning boss from a line between the second and third positioning bosses is 172.9±0.1 mm, wherein a distance between the second and third positioning bosses is 158.21±0.1 mm.

7. The carrier according to claim 1, wherein the platform comprises, on a lower face, two tracks along which the carrier is movable.

8. The carrier according to claim 1, wherein the platform unit further comprises a lateral light source module comprising two light boxes on two opposite sides of the slot of the platform, wherein each of the light boxes is operable to cast light onto transparent container on the carrier.

9. The carrier according to claim 8, wherein each of the light boxes is operable to cast light onto transparent container on the carrier at an angle of 0 to 6 degrees.

10. The carrier according to claim 8, wherein each of the light boxes comprises a slit through which the light box casts light in the form of a curtain.

11. The carrier according to claim 8, wherein the lateral light source module further comprises two columns for movably supporting the light boxes.

12. The carrier according to claim 11, wherein the lateral light source module further comprises two vertical planks movably connected to the columns respectively, wherein the light boxes are pivotally connected to the vertical planks respectively.

13. The carrier according to claim 11, wherein each of the lateral light source module further comprises pivots connected to portions of a corresponding one of the vertical planks.

14. A mask inspection machine comprising the platform module of claim 1 and a first inspection unit for inspecting the lower face of the mask and a second inspection unit for inspecting the upper face of the mask.

* * * * *